United States Patent
Cooke et al.

(10) Patent No.: US 6,651,237 B2
(45) Date of Patent: Nov. 18, 2003

(54) SYSTEM AND METHOD FOR H-TREE CLOCKING LAYOUT

(75) Inventors: Laurence H. Cooke, Los Gatos, CA (US); Kumar Venkatramani, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 168 days.

(21) Appl. No.: 09/765,959

(22) Filed: Jan. 18, 2001

(65) Prior Publication Data

US 2001/0025368 A1 Sep. 27, 2001

Related U.S. Application Data

(63) Continuation of application No. 60/177,048, filed on Jan. 18, 2000.

(51) Int. Cl.$^7$ ................................................. G06F 17/50
(52) U.S. Cl. .................................. 716/13; 716/12; 716/4
(58) Field of Search ........................ 716/13.1, 14, 10, 716/12, 9, 21, 1

(56) References Cited

U.S. PATENT DOCUMENTS

| | | | |
|---|---|---|---|
| 4,872,169 A | | 10/1989 | Whetsel, Jr. |
| 5,557,779 A | | 9/1996 | Minami ...................... 395/500 |
| 5,774,371 A | * | 6/1998 | Kawakami .................... 716/10 |
| 6,148,432 A | * | 11/2000 | Brown ........................... 716/1 |
| 6,237,128 B1 | * | 5/2001 | Folberth et al. ............... 716/1 |
| 6,260,175 B1 | * | 7/2001 | Basel ............................. 716/1 |
| 6,286,128 B1 | | 9/2001 | Pileggi et al. ................ 716/18 |
| 6,292,929 B2 | | 9/2001 | Scepanovic et al. .......... 716/14 |
| 6,305,001 B1 | | 10/2001 | Graef |
| 6,311,302 B1 | | 10/2001 | Cassetti et al. |
| 6,311,313 B1 | * | 10/2001 | Camporese et al. .......... 716/21 |
| 6,327,696 B1 | * | 12/2001 | Mahajan ....................... 716/12 |
| 6,367,051 B1 | | 4/2002 | Pileggi et al. |
| 6,367,060 B1 | | 4/2002 | Cheng et al. |

OTHER PUBLICATIONS

Chao, Ting–Hai et al.; "A Clock Net Routing Algorithm for High Performance VLSI"; *Proceedings of 1992 European Conference on Design Automation*; 1994; vol. 1; pp. 343–347.

Sato Hidenori et al.; "A Balanced–Mesh Clock Routing Technique Using Circuit Partitioning"; *Proceedings of 1996 European Design and Test Conference*; 1996; vol. 1; pp. 467–470.

Khan, Wasim et al.; "An Hierarchical Approach to Clock Routing In High Performance Systems"; *IEEE 1994 International Symposium On Circuits And Systems*; Jan. 1994; vol. 1; pp. 467–470.

Jackson, M.A.B. et al.; "Clock Routing For High–Performance ICs"; *Proceedings of 27$^{th}$ ACM/IEEE Design Automation Conference*; Jun. 24, 1990; vol. 1; pp. 573–579.

* cited by examiner

*Primary Examiner*—Vuthe Siek
*Assistant Examiner*—Binh C. Tat
(74) *Attorney, Agent, or Firm*—Bingham McCutchen LLP

(57) ABSTRACT

A technique for constructing a balanced H-Tree clock layout suited for application to clock signals in integrated circuits, but applicable to other signals requiring balanced distribution over a wide area, involves routing clock wires in a circuit design wherein internal circuit blocks are divided, to the extent possible, into groups having an equal number of circuit blocks. An upper H-Tree clock layout structure is established using the center of mass of each of the circuit block groups as guideposts. Adjustments in wire length to balance the wires of the H-Tree layout. A lower H-Tree clock layout structure is established using center points between pairs of adjacent or nearby circuit blocks as guideposts for the endpoints of clock wires, and then routing, to the extent necessary, wire segments to the individual circuit blocks.

24 Claims, 14 Drawing Sheets

SYSTEM AND METHOD FOR H-TREE CLOCKING LAYOUT

CROSS REFERENCE TO RELATED APPLICATIONS

This application is a continuing application of copending U.S. Provisional Application Ser. No. 60/177,048, filed on Jan. 18, 2000. The foregoing application is hereby incorporated by reference as if set forth fully herein.

BACKGROUND OF THE INVENTION

1. Field of the Invention

The field of the present invention relates to electronic design automation and, more particularly, to methods and systems for constructing H-Tree clocking layouts for integrated circuits.

2. Background

Designs of integrated circuits (ICs) can frequently be divided into sub-sections, or blocks, according to functional characteristics (e.g., analog vs. digital), or other distinguishing features. Moreover, it is increasingly common in chip design to utilize pre-developed "virtual" component blocks, often referred to as Intellectual Properties (IPs) to suggest their proprietary nature, to design complete systems on a chip. Most chip designs require a common clocking signal to be distributed to all of the circuit blocks (or virtual component blocks) of the chip. The clock signal typically enters from a single location (corresponding to a clock I/O pin) of the chip, and is distributed by metal wires from the I/O pad to all of the circuit blocks (or virtual component blocks) requiring use of the clock signal. An ad hoc layout of the clock wires, however, can be disadvantageous, because such a layout generally results in uneven impedance characteristics along the various branches of the clock signal paths. Consequently, different circuit blocks (and virtual component blocks) will receive the same clocking signal at different instants of time, and the clock signal will have different skew characteristics at different circuit blocks (or virtual component blocks). This situation can lead to unsatisfactory chip performance.

One technique that attempts to overcome the problem of uneven impedance characteristics in the different clock signal branches is construction of a balanced H-Tree clock signal layout. In a balanced H-Tree layout, a set of wires for carrying the clock signal is laid out in a tree structure in advance of placement of the circuit blocks (or virtual components). The shape of the clock signal layout is such that each division or split of the clocking signal wire leads into two branches of identical length. The result is that each branch of the clocking signal path has the same impedance characteristics, leading to a balanced clock signal. A drawback of using a conventional balanced H-Tree layout, however, is that the set of wires is fixed prior to placement of the circuit blocks (or virtual component blocks), which can make placement of the circuit blocks (or virtual component blocks) difficult and possibly inconvenient, and sometimes preclude placement of all of the desired circuit blocks (or virtual component blocks).

It would therefore be advantageous to provide a balanced H-Tree layout for a clocking signal which is flexible and does not place undue restrictions on placement of circuit blocks or virtual component blocks, yet provides for an evenly balanced clocking signal.

SUMMARY OF THE INVENTION

The invention provides in one aspect systems and methods for constructing a balanced H-Tree, particularly well suited for application to clock signals in integrated circuits, but applicable to other signals requiring balanced distribution over a wide area as well, in the same or other contexts.

In a preferred embodiment as disclosed herein, a circuit design is provided having a number of circuit blocks in a power of two (preferably sixteen or fewer circuit blocks). The circuit blocks are divided into circuit block groups of equal number (e.g., four). An upper H-Tree clock structure is established using the center of mass of each of the circuit block groups as guideposts, and making adjustments in wire length to balance the H-Tree. A lower H-Tree clock structure is established using center points between pairs of adjacent or nearby circuit blocks as guideposts for the endpoints of clock wires, and then routing, if necessary, wire segments to the individual circuit blocks.

Further embodiments, modifications, variations and enhancements are also described herein.

BRIEF DESCRIPTION OF THE DRAWINGS

The invention may be better understood by reference to the drawings, wherein.

DETAILED DESCRIPTION OF PREFERRED EMBODIMENTS

Figure 1:
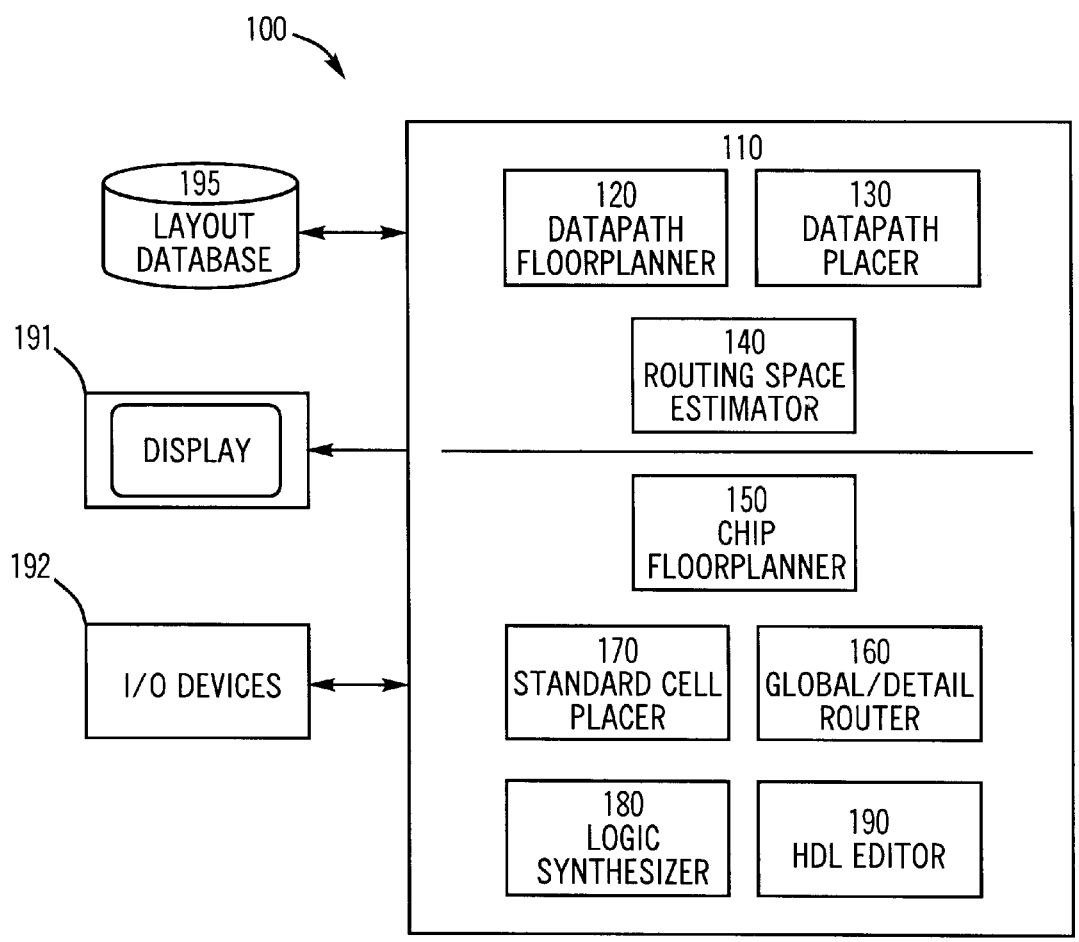
FIG. 1 is a diagram of a computer system that may be used in connection with various embodiments of the invention as described herein.

While various embodiments are described herein with reference to integrated circuits constructed with circuit blocks in a generic sense, it should be understood that the principles contained herein apply to circuits and systems constructed with virtual component blocks or any other type of circuit blocks, or any mixture of types of circuit/component blocks, and the invention is not intended to be limited to any particular type of circuit blocks. The techniques described herein are especially well suited for an environment in which a plurality of virtual components are placed together to form a cohesive system on a single chip.

In one or more embodiments as described herein, a system and method for constructing a balanced H-Tree particularly well suited for application to clock signals in integrated circuits is provided. In various embodiments, a layout of clocking wires is conducted after initial or preliminary placement of the circuit blocks has been performed, allowing a greater degree of flexibility as to where circuit blocks can be placed.

A particularly useful type of circuit block may be referred to as a virtual component block. Virtual component blocks are typically generated as part of a design process which can involve a number of steps, depending upon the level of abstraction desired for the particular circuit design. Chip designers often use electronic design automation (EDA) software tools to assist in the design process, and to allow simulation of a chip design prior to prototyping or production. Chip design using EDA software tools generally involves an iterative process whereby the chip design is gradually perfected. Typically, the chip designer builds up a circuit by inputting information at a computer workstation generally having high quality graphics capability so as to display portions of the circuit design as needed. A top-down design methodology is commonly employed using hardware description languages (HDLs), such as Verilog® or VHDL, for example, by which the designer creates an integrated circuit by hierarchically defining functional components of the circuit, and then decomposing each component into smaller and smaller components.

The various components of an integrated circuit are initially defined by their functional operations and relevant inputs and outputs. The designer may also provide basic organizational information about the placement of components in the circuit using floorplanning tools. During these design states, the designer generally structures the circuit using considerable hierarchical information, and has typically provided substantial regularity in the design.

From the HDL or other high level description, the actual logic cell implementation is typically determined by logic synthesis, which converts the functional description of the circuit into a specific circuit implementation. The logic cells are then "placed" (i.e., given specific coordinate locations in the circuit layout) and "routed" (i.e., wired or connected together according to the designer's circuit definitions). The placement and routing software routines generally accept as their input a flattened netlist that has been generated by the logic synthesis process. This flattened netlist identifies the specific logic cell instances from a target standard cell library, and describes the specific cell-to-cell connectivity.

Further explanation of a particular chip design process, with emphasis on placement and routing of datapaths, is set forth, for example, in U.S. Pat. No. 5,838,583, hereby incorporated by reference as if set forth fully herein.

FIG. 1 is a diagram of a computer system that may be used in connection with various embodiments as described herein. As shown in FIG. 1, a computer system 100 includes a computer 110 connected to a display 191 and various input-output devices 192. The computer 110 may comprise one or more processors (not shown), as well as working memory (e.g., RAM) in an amount sufficient to satisfy the speed and processing requirements of the system. The computer 110 may comprise, for example, a SPARC™ workstation commercially available from Sun Computers, Inc. of Santa Clara, Calif., or any other suitable computer.

The computer 110 contains stored program code including, in one embodiment, a datapath floorplanner 120, a datapath placer 130 and a routing space estimator 140. The datapath flooplanner 120 provides for the definition of datapath functions, datapath regions, and constraints on these for the purpose of interactive floorplanning operations by the circuit designer, and the control of placement operations of the datapath placer 130. The datapath placer 130 determines the placement of datapath functions within datapath regions, and the placement of logic cell instances within each datapath function, according to the constraints defined by the circuit designer. The routing space estimator 140 estimates routing space required for routing the datapath functions, given the placement of such functions by the datapath placer 130.

In support of the above-mentioned system components, a chip floorplanner 150, global/detail router 160, standard cell placer 170, logic synthesizer 180, and HDL editor 190 may be usefully employed. Operation of the chip floorplanner 150, global/detail router 160, standard cell placer 170, logic synthesizer 180, and HDL editor 190 is conventional, as the design of these components is well known in the art of electronic design automation. Commercially available examples of these system components are Preview™, Cell3™, QPlace™, Synergy™, and Verilog®, respectively. The computer 110 may also be provided with various tools for assisting in construction of a balanced H-Tree for clocking signal layout. Examples of such tools, or of their general functionality, are described hereinafter.

The computer 110 is preferably coupled to a mass storage device (e.g., magnetic disk or cartridge storage) providing a layout database 195 with which the foregoing system components interface. The layout database 195 may be implemented using the EDIF database standard. The computer 110 may also comprise or be connected to mass storage containing one or more component libraries (not shown) specifying features of electrical components available for use in circuit designs.

Figure 2:
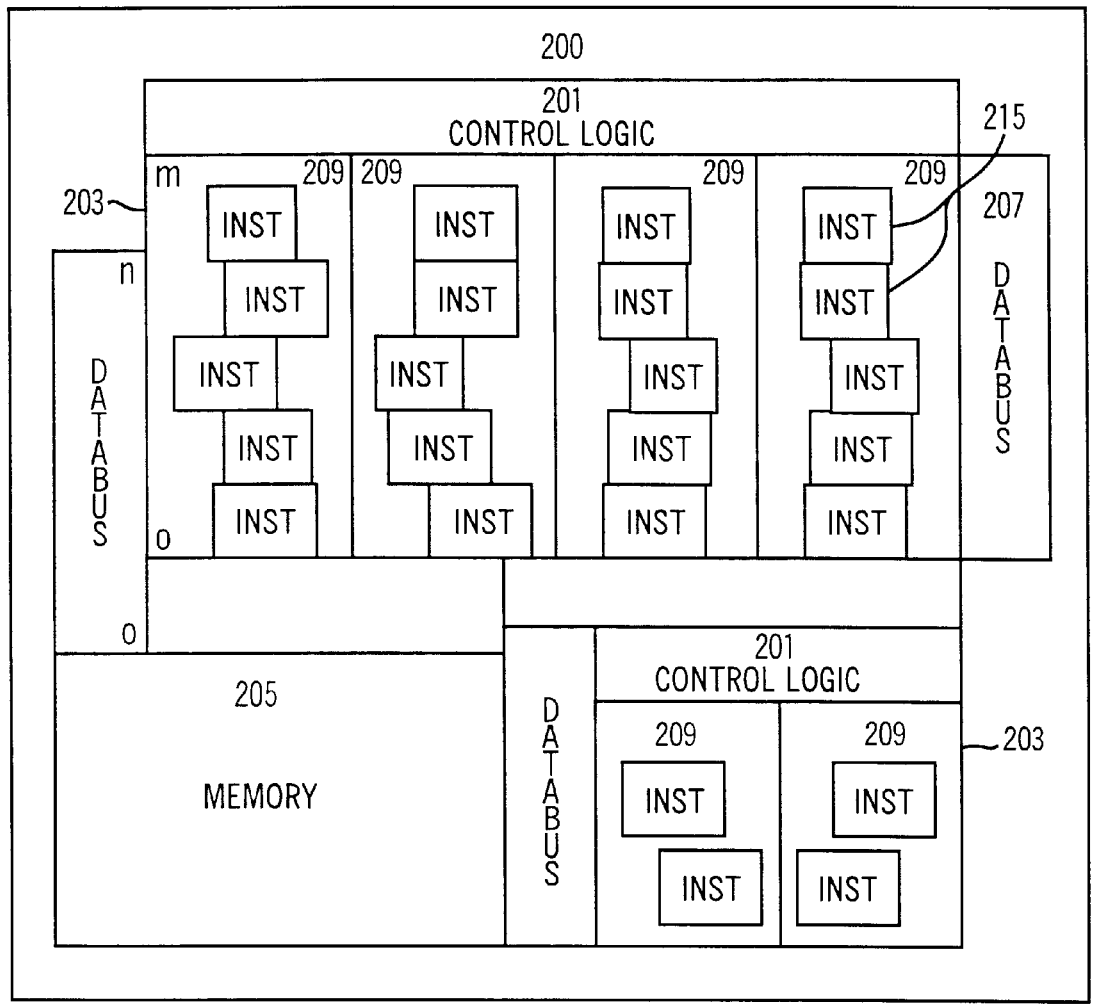
FIG. 2 is a diagram of a simplified integrated circuit as may be represented in the form of a virtual component block.

Referring now to FIG. 2, there is shown a schematic illustration of a simplified integrated circuit 200 that may be represented by virtual circuit design data stored in the layout database 195. In actual, more realistic integrated circuit designs, the integrated circuit 200 would be far more complicated. However, FIG. 2 is useful for purposes of illustration. As shown therein, the integrated circuit 200 comprises of a plurality of control regions 201, datapath regions 203, and memory 205. The various control regions 201, datapath regions 203 and memory 205 are interconnected with databuses 207 generally spanning multiple bits. Each datapath region 203 may comprise a plurality of datapath functions 209. A datapath function 209 may utilize some or all of the bits available from the databus 207. A datapath function 309 may comprise a plurality of cell instances 215 which enable some form of signal or logic transformation of the data passed by the databus 207. The cell instance 215 within a datapath function 209 generally operates on the data carried on the datapath function 209.

As represented in the schema of the layout database 195, the integrated circuit 200 is comprised of a plurality of instances and a plurality of nets. A net interconnects a number of instances, by associating pins on each of the instances.

Figure 3:
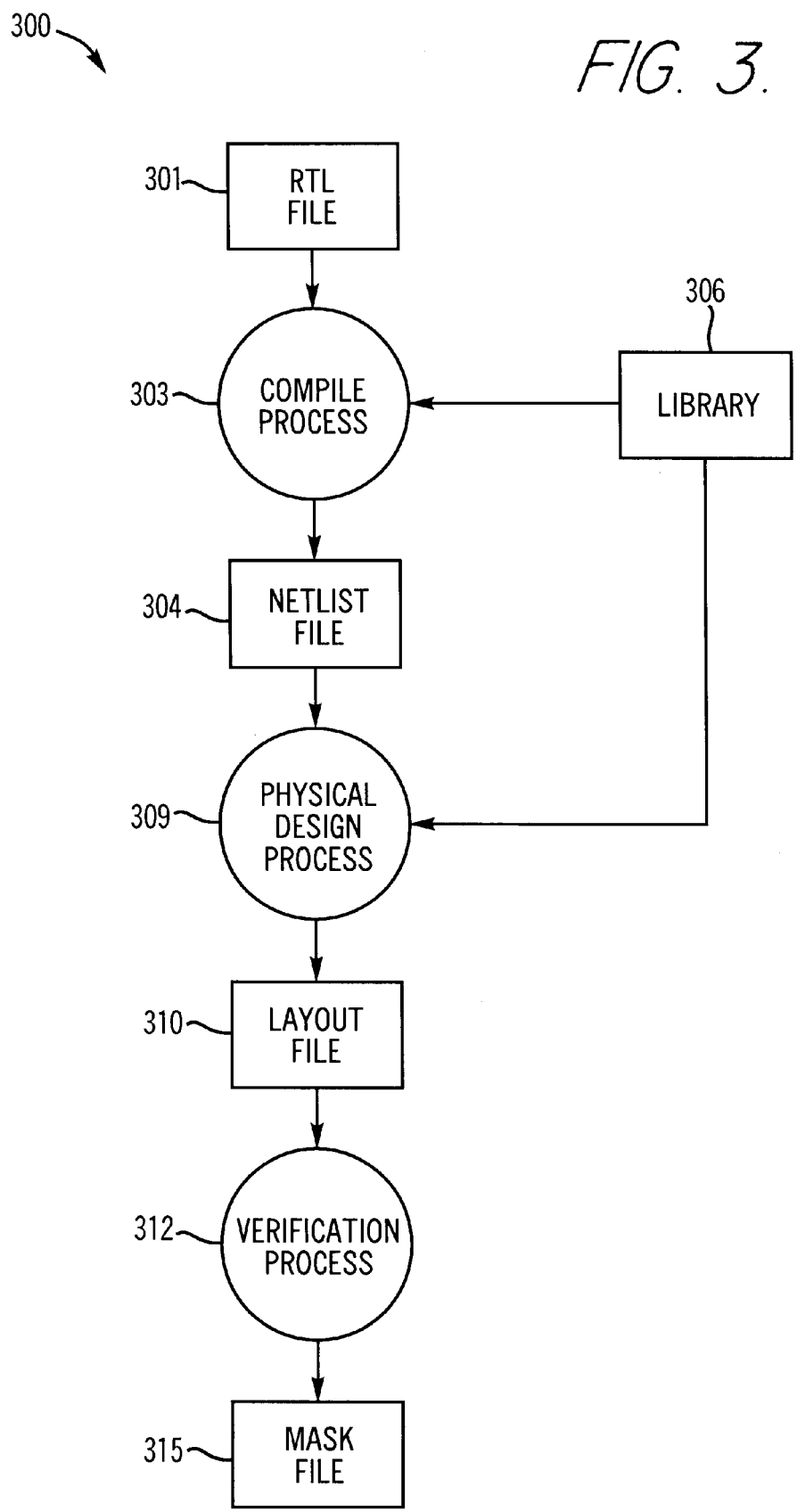
FIG. 3 is a diagram of a general process flow for a circuit design, illustrating various levels of circuit abstraction.

FIG. 3 is a diagram of a general process flow for a circuit design, illustrating some of the various levels of circuit abstraction as described above. As illustrated in FIG. 3, a register transfer logic (RTL) file 301 in the form of an HDL file or other high level functional description undergoes a compile process 303, which typically includes some form of logic synthesis, and converts the functional description of the circuit into a specific circuit implementation which may be stored in the form of a netlist file 304. As part of the compile process 303, a component library 306 is generally referenced, which stores information concerning what types of design components are available, and the characteristics of those design components which are needed in order to determine their functional connectivity. At this process stage, some attempt may be made at circuit optimization in order to minimize the number of components used in the circuit design. The netlist file 304, as previously noted, generally identifies the specific logic cell instances from a target standard cell library, and describes the specific cell-to-cell connectivity.

By application of a physical design process 309 shown in FIG. 3, the logic cells of the netlist file 304 are then placed and routed, resulting in a layout file 310. The physical design process 309 may include area minimization efforts. The component library 306 is utilized in this process stage in order to obtain information concerning the sizes of gates and other components that may be present in the netlist file 304.

From the layout file 310, a verification process 312 may be run, as further illustrated in FIG. 3, resulting in a mask file 315 in, for example, a GDSII or CIF format. The mask file 315 may be provided to a foundry, and contains enough information to allow the foundry to manufacture an actual integrated circuit therefrom.

Figure 4:
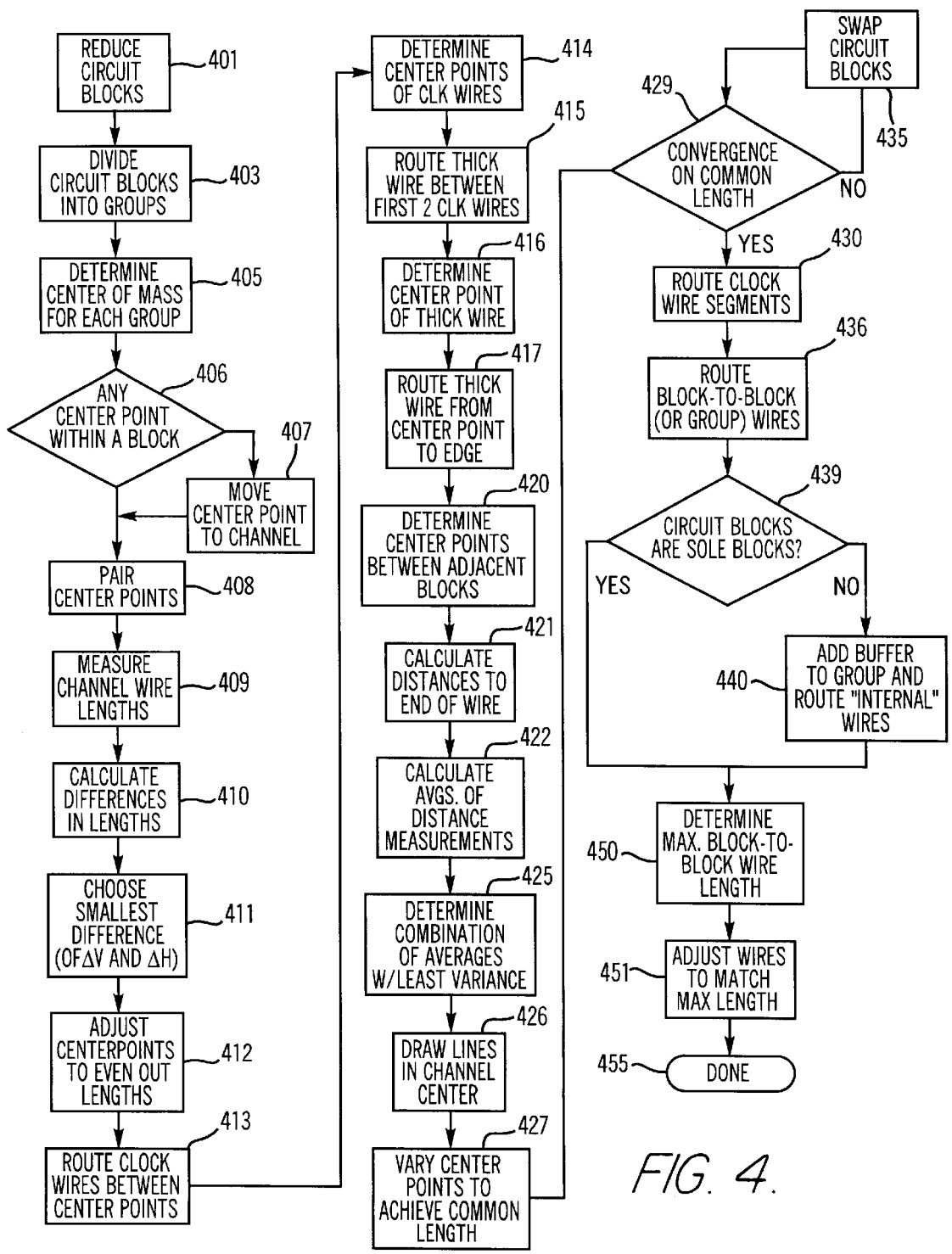
FIG. 4 is a process flow diagram of a preferred technique for constructing a balanced H-Tree, such as for layout of a clocking signal.

FIG. 4 is a flow diagram of a preferred process 400 for constructing a balanced H-Tree, such as for layout of a clocking signal. The process 400 may be implemented by a circuit designer utilizing a computer (such as computer 110 shown in FIG. 1) preferably having access to routing and various other software tools as described below.

In a first step 401 of the process 400 set forth in FIG. 4, the set of circuit blocks for a circuit design are preferably combined, if need be, so that the circuit blocks number no more than a predefined maximum. A principle reason for this step 401 is that a greater number of circuit blocks require wider wires at the upper clock tree levels, resulting in undesirable wire widths at the upper levels. For example, a circuit design with thirty-two circuit blocks using an H-Tree clock layout would need a trunk size (i.e., top-level input clock wire) that is thirty-two or more times the minimum wire width used for routing the circuit blocks. In a preferred embodiment, the predefined maximum number of circuit blocks is sixteen. Alternatively, the predefined maximum number of circuit blocks is some other power of two. If there are more circuit blocks in number than the selected power of two (i.e., 16), then the blocks are preferably clustered so that their number is equal to the selected power of two. An example of such a process is illustrated in FIGS. 5 and 6.

Figure 5:
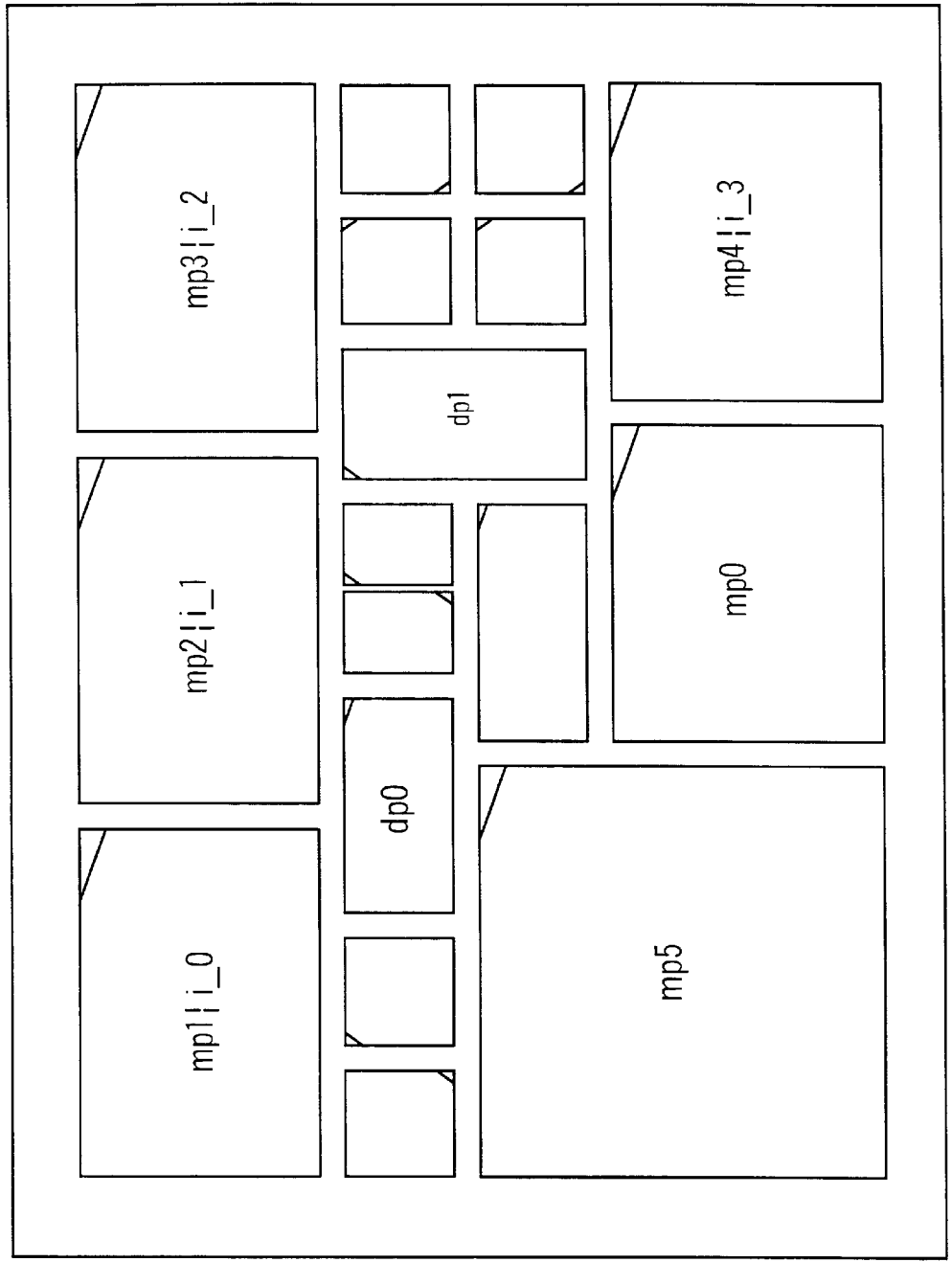
FIG. 5 is a diagram of an example of a circuit design after initial or preliminary placement of circuit blocks, but prior to routing of the clocking signal.
Figure 6:
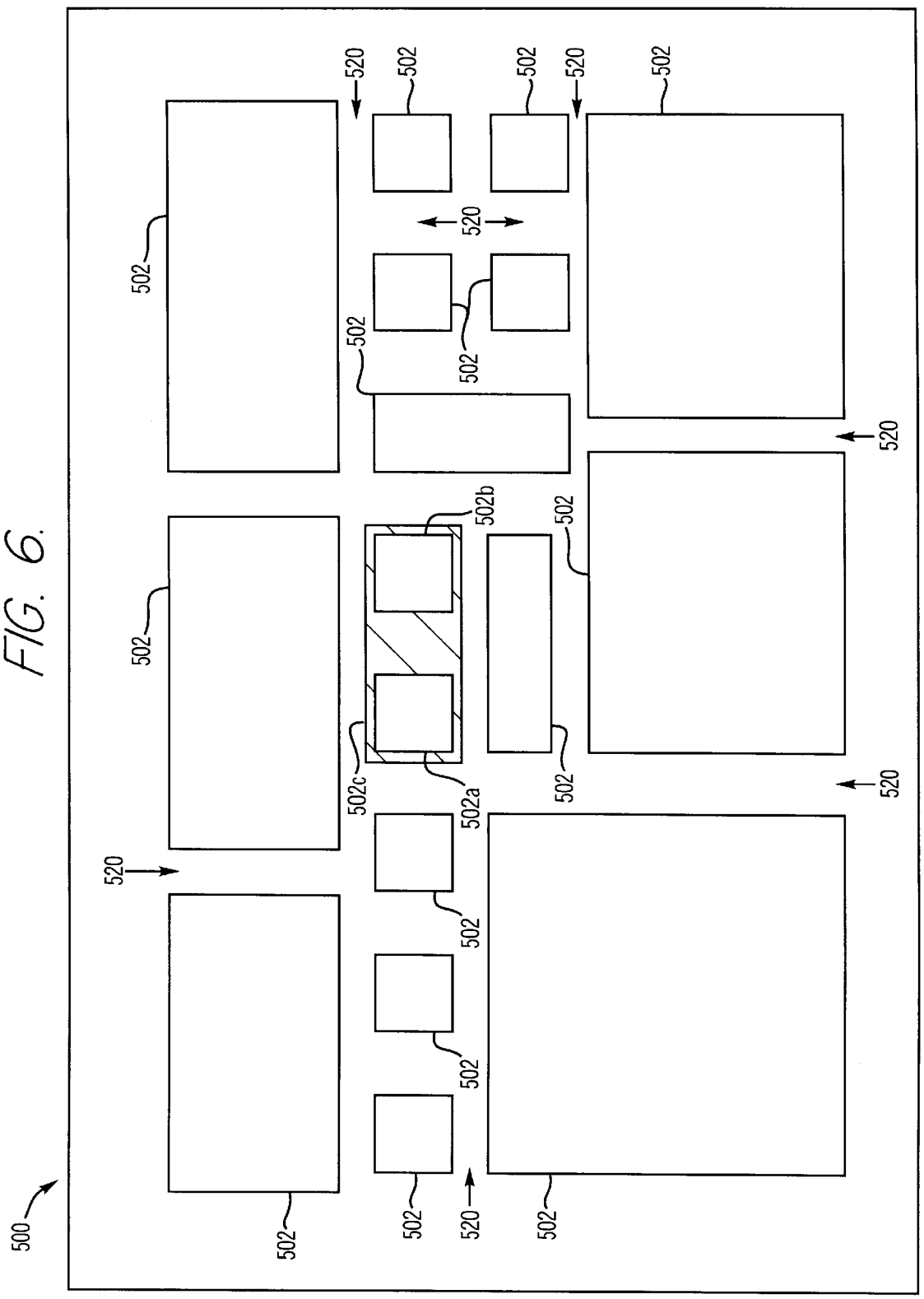
FIG. 6 is a diagram of the circuit design of FIG. 5, modified to condense two small circuit blocks into a larger circuit block.

FIG. 5 is a diagram of an example of a circuit design 500 after initial or preliminary placement of circuit blocks (i.e., after floorplanning), but prior to routing of the clocking signal. FIG. 6 is a diagram of the same circuit design 500, but simplified diagrammatically to show only the relative positions and sizes of the circuit blocks. As illustrated in FIGS. 5 and 6, a total of seventeen circuit blocks 502, separated by channels 520, are present in the circuit design 500. According to a preferred methodology, two of the circuit blocks 502a, 502b are combined such that they are treated, for the purposes of clock layout, as a single circuit block 502. FIG. 6 shows the modification of the circuit design 500 of FIG. 5 in which the two small circuit blocks 502a, 502b are condensed into a larger circuit block 502c. Preferably, the two circuit blocks chosen for clustering or grouping together are selected so as to facilitate the later steps of the process 400, including step 403 below, wherein the remaining blocks 502 are divided into a number of groups (preferably four) of roughly equal area, each comprising circuit blocks 502 in a proximate region.

If there are eight or fewer circuit blocks 502 in the circuit design 500, then some of the steps of the process 400 can be eliminated. With each reduction in the number of circuit blocks 502 to the next lowest power of two, more steps of the process 400 can be eliminated.

Figure 7:
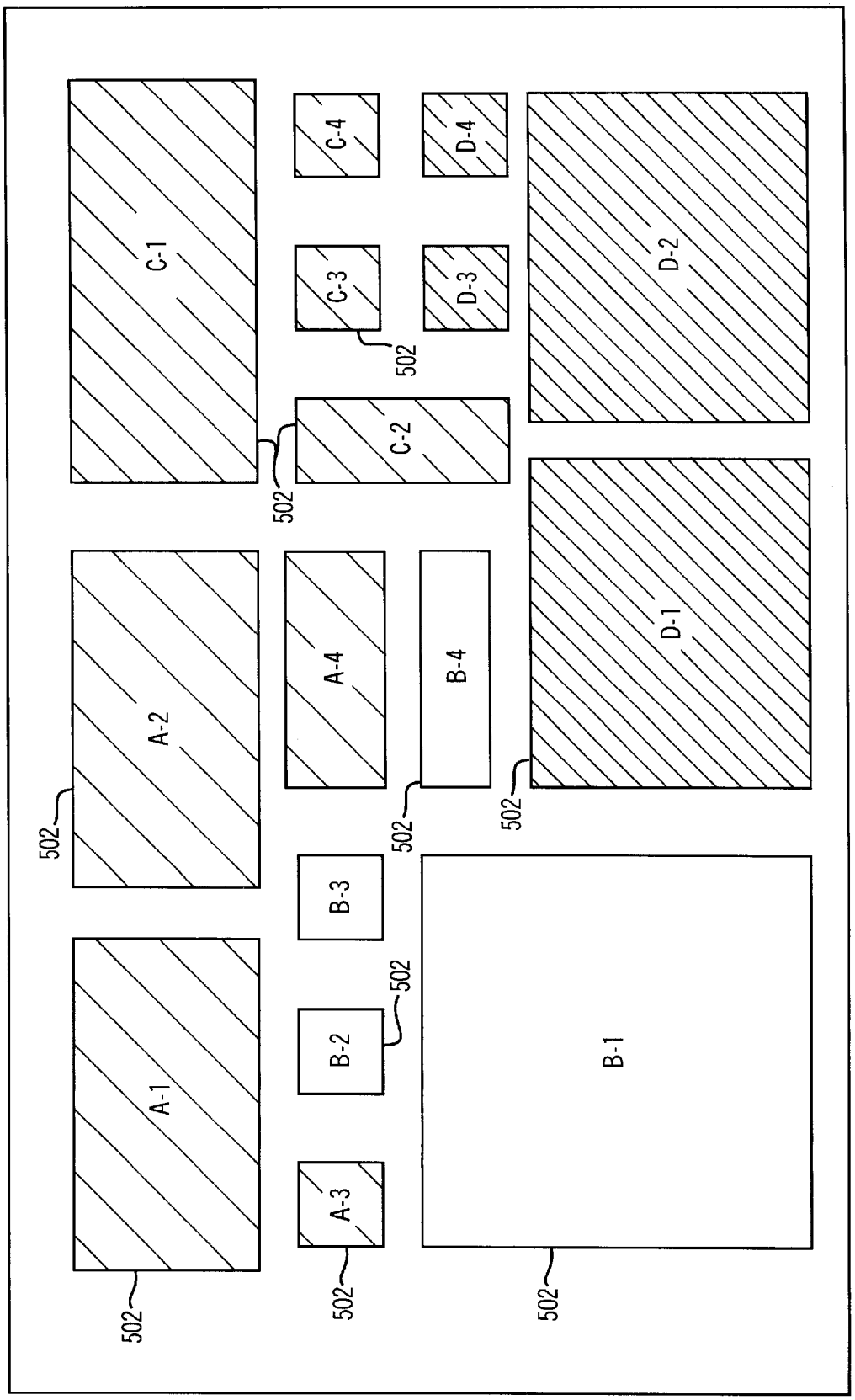
FIG. 7 is a diagram of the circuit design of FIG. 6, with circuit blocks divided into groups.

In a next step 403 of the process 400 illustrated in FIG. 4, the remaining blocks 502 are divided into four groups of roughly equal area, each comprising circuit blocks 502 nearby to one another. Each group of circuit blocks 520 may generally be associated with one of four quadrants into which the circuit design 500 can be divided at an abstract level. In a typical circuit design 500, the area of the circuit blocks 502 will generally be known by the time of placement. Therefore, it is trivial to sum up the total area of each potential group of circuit blocks 502. FIG. 7 is a diagram of the circuit design of FIG. 6, with circuit blocks 502 divided into four groups A, B, C and D of roughly equal area. Circuit blocks A1, A2, A3 and A4 are in group A; circuit blocks B1, B2, B3 and B4 and in group B; circuit blocks C1, C2, C3 and C4 are in group C; and circuit blocks D1, D2, D3 and D4 are in group D.

Figure 8:
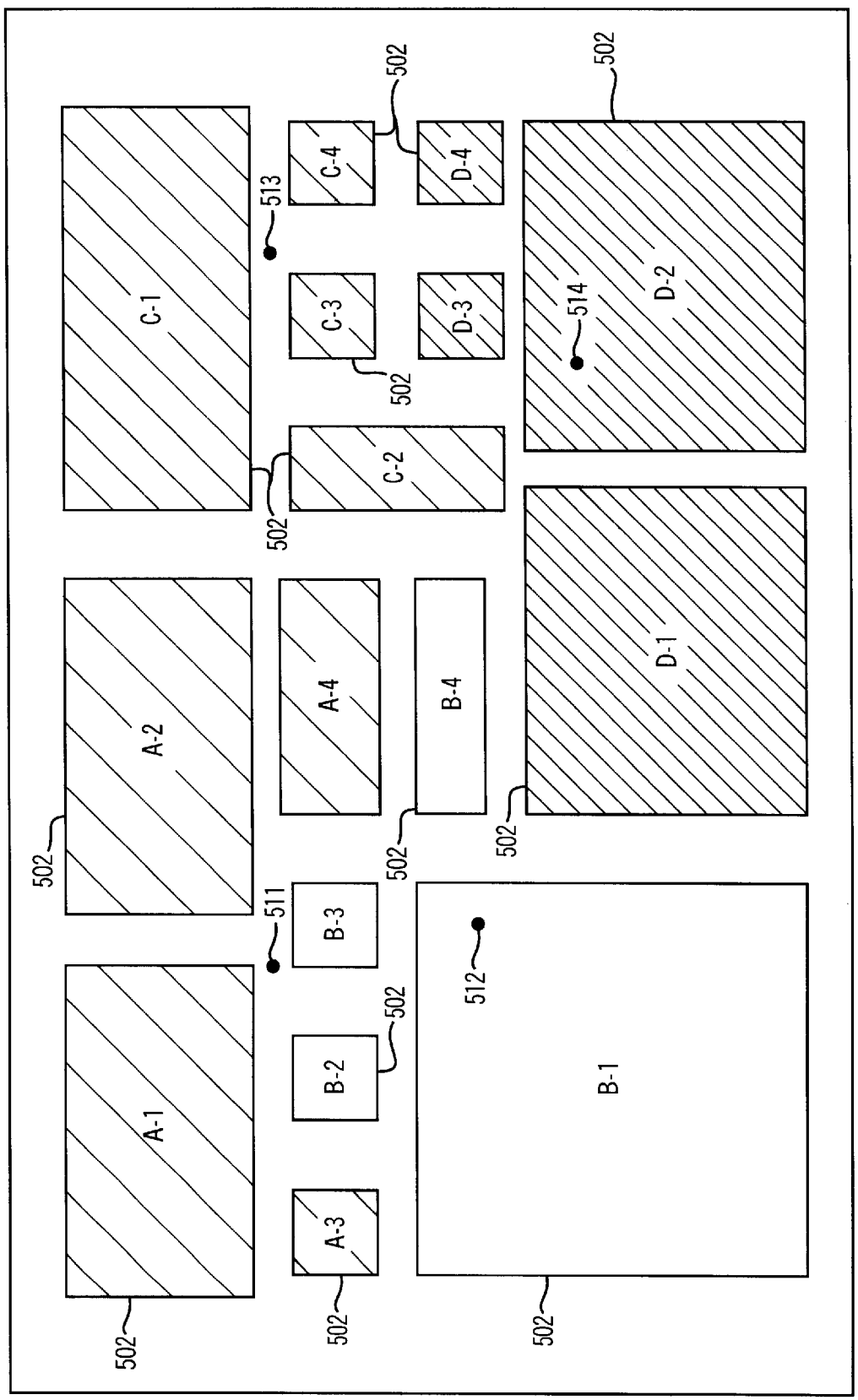
FIG. 8 is a diagram of the circuit design of FIG. 7, illustrating the approximate center points of each set of circuit blocks.
Figure 9:
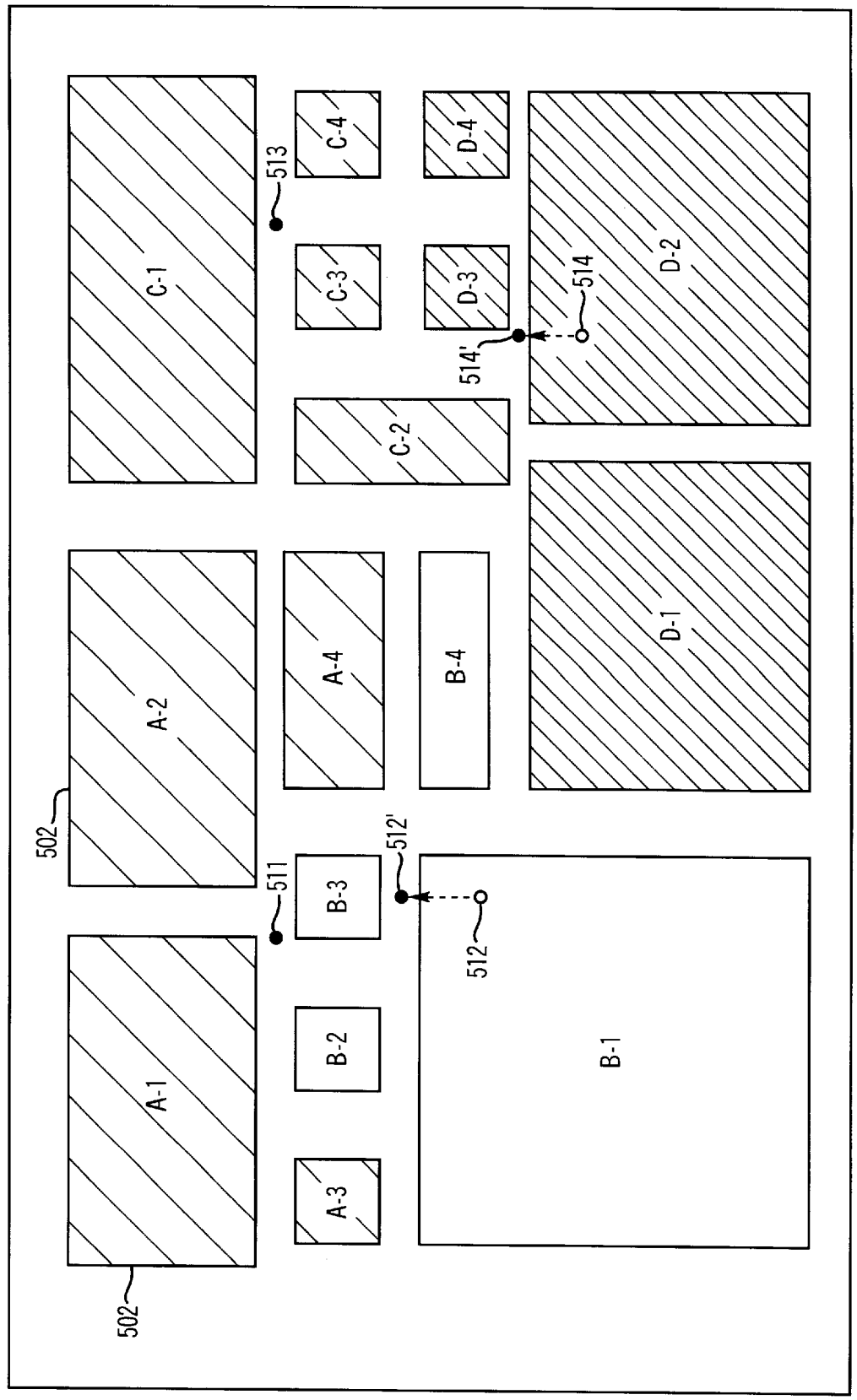
FIG. 9 is another diagram of the circuit design of FIG. 7, but with the approximate center points moved to new center points in the nearest adjacent channels.

In a next series of steps 405 through 417 of the process 400 illustrated in FIG. 4, an upper structure for the H-Tree clock layout is generated. In more detail, in step 405, the center point (i.e., center of mass) for each circuit block group A through D is determined. Given the known area of each circuit block 502 and the placement information thereof, determining the center point for each circuit block group A through D involves straightforward algebraic calculations. FIG. 8 is a diagram of the circuit design 500 of FIG. 7, illustrating the approximate center points 511, 512, 513 and 514 of circuit block groups A, B, C and D, respectively. In a next step 406, a determination is made whether any center points 511, 512, 513 or 514 lie within a circuit block 502. If not, the process 400 proceeds to step 408. Otherwise, in step 407, the center point is moved into the channel 520 closest thereto. FIG. 9 illustrates the circuit design 500 of FIG. 7, with center point 512 moved to new center point 512' to move it out of block B1, and center point 514 moved to new center point 514' to move it out of block D2, resulting in a modified set of center points 511, 512', 513 and 514'.

Figure 10:
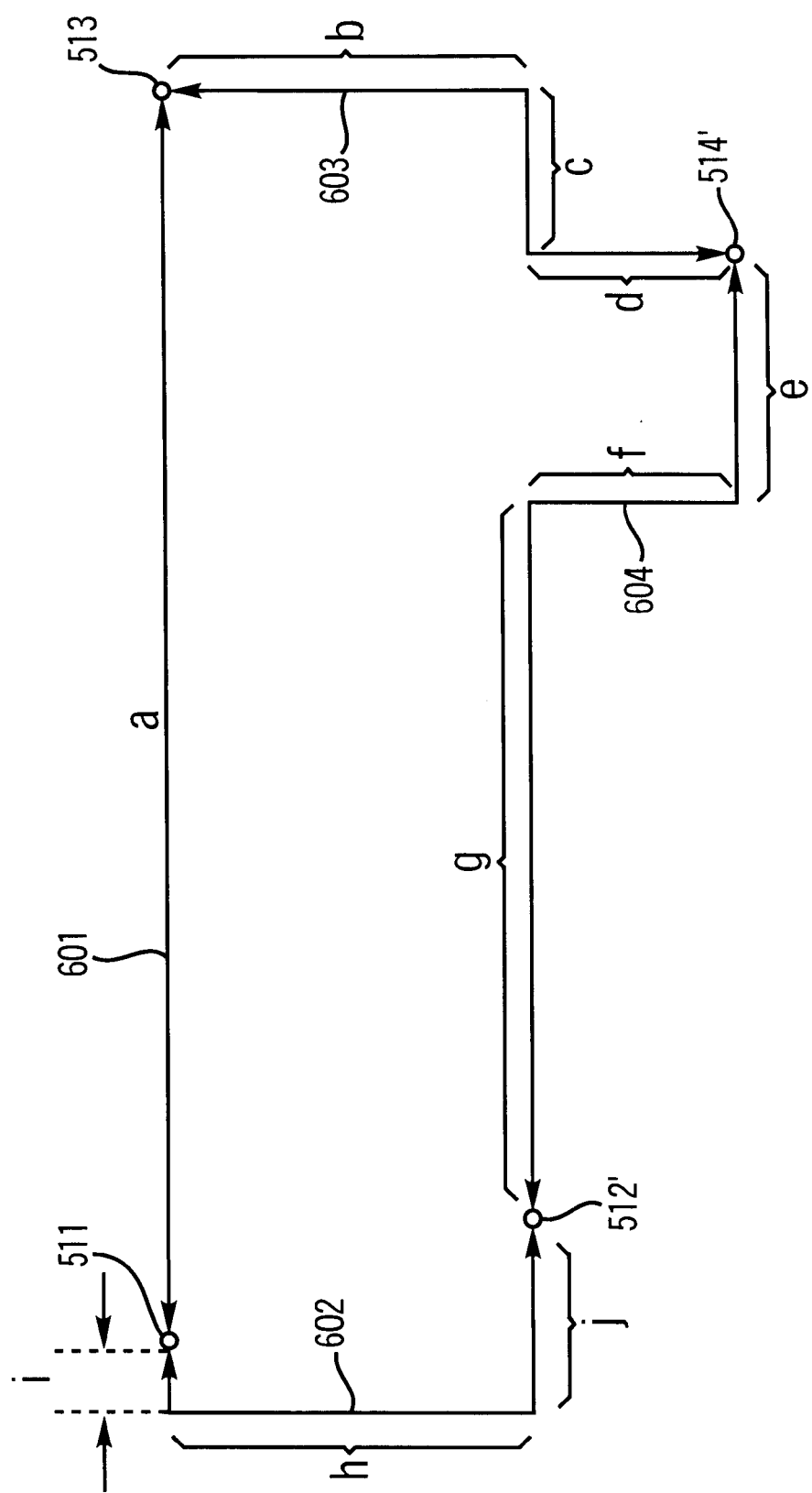
FIG. 10 is a diagram of illustrating comparison of the distances between center point pairs, vertically and horizontally, using the modified center points of FIG. 9.

In a next step 408, the modified set of four center points 511, 512', 513 and 514' are paired vertically, and then again horizontally. Thus, in the example shown, center point 511 is paired with center point 512' vertically, and center point 513 is paired with center point 514' vertically. Center point 511 is then paired with center point 513 horizontally, and center point 512' is paired with center point 514' horizontally. In a next step 409, the channel wire length is measured between each of the non-diagonal paired center points. The channel wire length is measured using "Manhattan distance"—that is, along the channels 520 using the shortest channel path, but not through any of the circuit blocks 502. FIG. 10 illustrates the channel wire length measurement according to the aforementioned technique. The length of channel wire 601 connecting center points 511 and 513 horizontally is equal to length a; the length of channel wire 604 connecting center points 512' and 514' horizontally is equal to the sum of lengths e, f and g; the length of channel wire 602 connecting center points 511 and 512' vertically is equal to the sum of lengths h, i and j; and the length of channel wire 603 connecting center points 513 and 514' vertically is equal to the sum of lengths b, c and d.

In a next step 410, the channel wire length for each of the center points pairs is compared, and the differentials are calculated. Thus, the length of channel wire 601 is compared against the length of channel wire 604 (to yield Δh), and the length of channel wire 602 is compared against the length of channel wire 603 (to yield Δv). These comparisons may be made in terms of absolute distance measurements, or else may be made in terms of percentages, or alternatively may be a weighted comparison based upon the ratio of the length and width of the chip. In a next step 411, the pairing of center points (i.e., vertical or horizontal) is selected such that the paired distances are most equal (i.e., the smallest differential Δh or Δv is selected). In the present example, it is assumed that Δh is less than Δv, such that the horizontal pairing of center points will be selected. A purpose of initially selecting the pair of wires 601, 604 most equal in length (versus wires 602 and 603) is to more easily achieve a balanced H-Tree layout. Similarly, a reason that "Manhattan distance" measurements are made is because the total length of the wires 601, 604, as routed around and between the circuit blocks 502, needs to be considered for purposes of balancing impedances along each clocking path.

Figure 11:
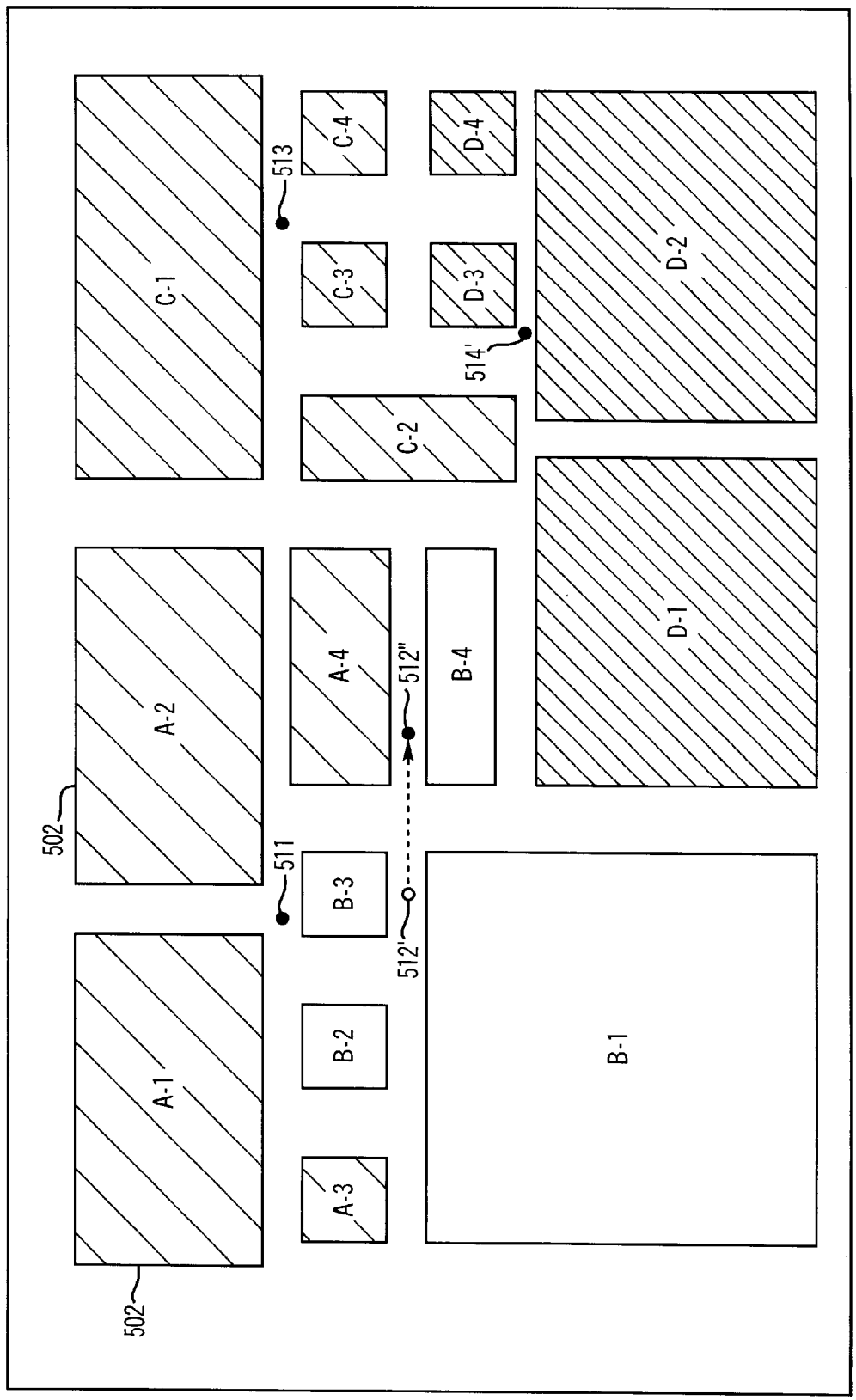
FIG. 11 illustrates adjustment of a center point to make wire lengths for the upper structure for the clock signal layout equal.

In the following step 412, the center points of the selected pairing are again adjusted, if need be, this time so that the paired distances are equal (using "Manhattan distance" measurements). FIG. 11 illustrates movement of center point 512' to center point 512'' in order to make the wire lengths 601 and 604 equal. The selection of which center point(s) 511, 512', 513 or 514' to move may depend upon a variety of criteria. In one embodiment, for example, a goal is to prevent, to the maximum extent possible, moving the adjusted center point away from the original center point. However, other criteria for selecting which center point(s) 511, 512', 513 or 514' to move may also be used.

Figure 12:
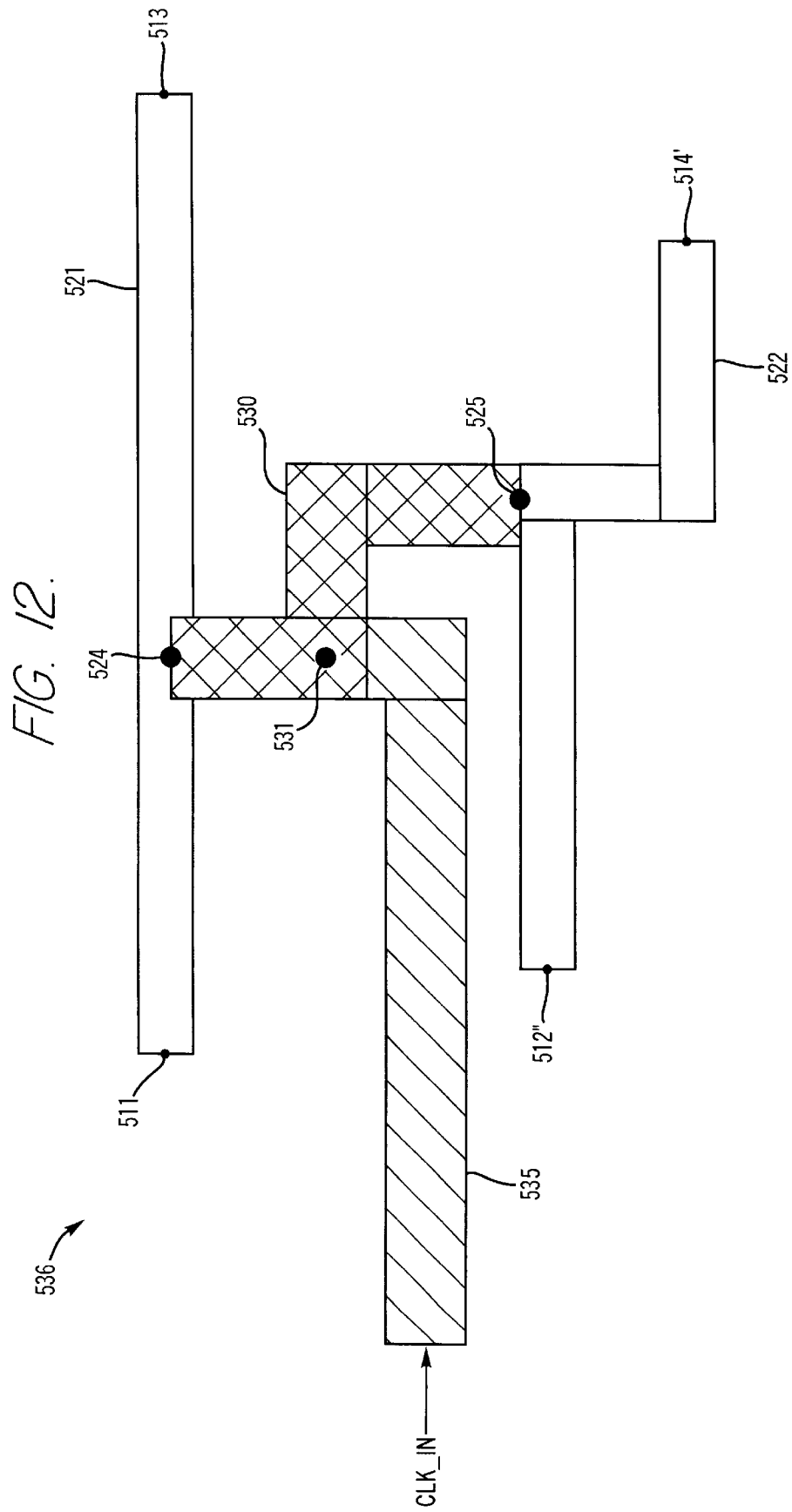
FIG. 12 is a diagram of the upper structure of the clock signal layout.

In a next step 413, a clock wire is routed between the center points in each of the center point pairs. FIG. 12 is a diagram showing, among other things, the two clock wires 521, 522 which are routed horizontally between center points from each of the center point pairs (i.e., between center points 511 and 512, and between center points 512'' and 514'). In a next step 414, the center point 524, 525 of each of wires 521, 522, respectively, are determined. In a next step 415, as further illustrated in FIG. 12, a clock wire 530 is routed between the center points 524, 525 of each of wires 521, 522. The width of clock wire 530 is preferably equal to the combination of widths of wires 521, 522—that is, twice as wide as either wire 521 or 522. In a next step 416, the center point 531 of clock wire 530 is determined. In a next step 417, as illustrated in FIG. 12, a clock wire 535 is routed from the center point 531 of the clock wire 530 to the nearest side of the circuit design (routing distance wise), while minimizing turns. The clock wire 535 is preferably the same width of clock wire 530 (that is, double the width of each of clock wires 521 and 522). Clock wires 521, 522, 530 and 535 in one aspect form an upper structure 536 for a balanced H-Tree clocking layout.

Figure 13:
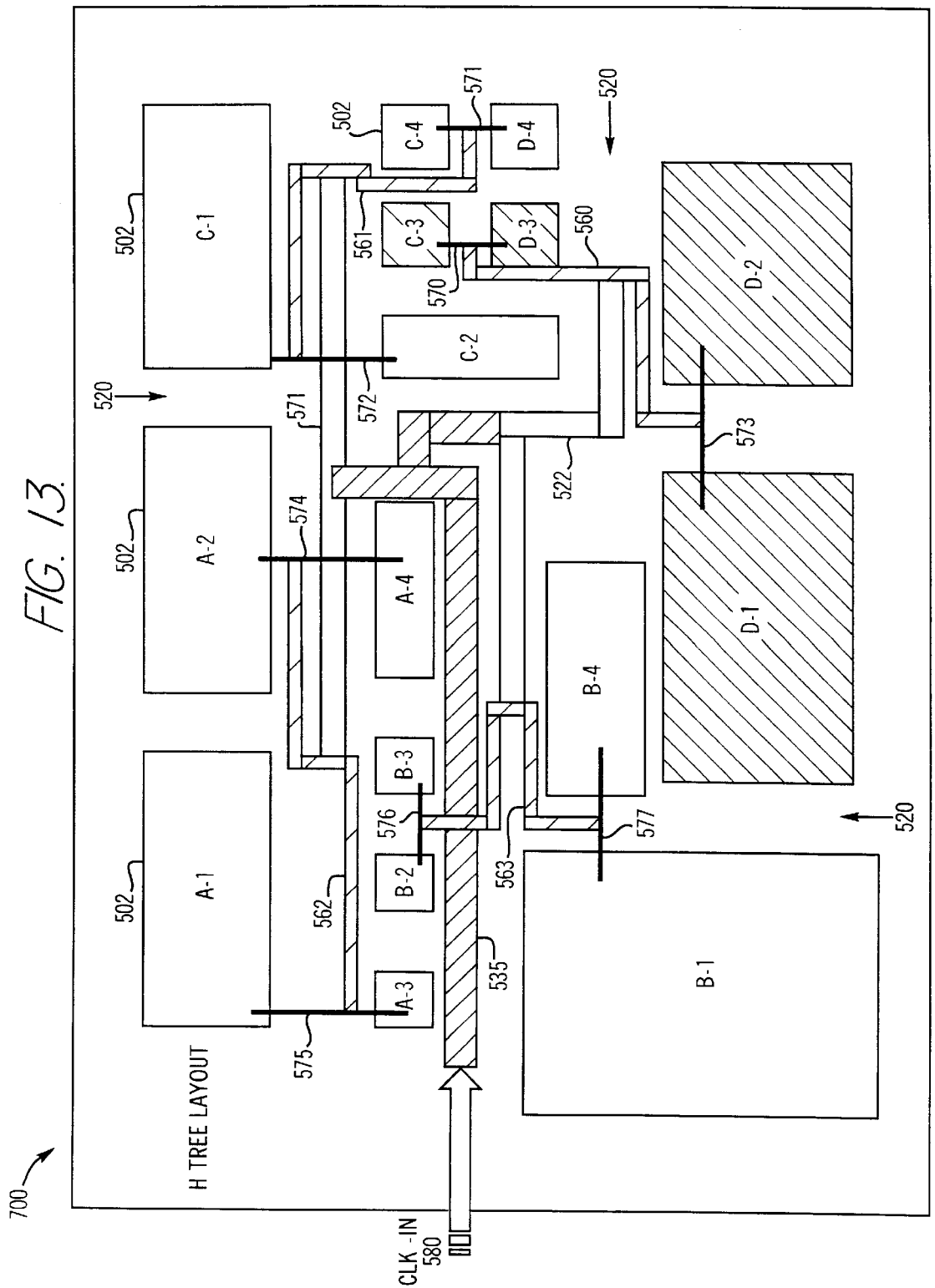
FIG. 13 is a diagram of the an example of a complete H-Tree clock signal layout for the original circuit design of FIG. 7.
Figure 14:
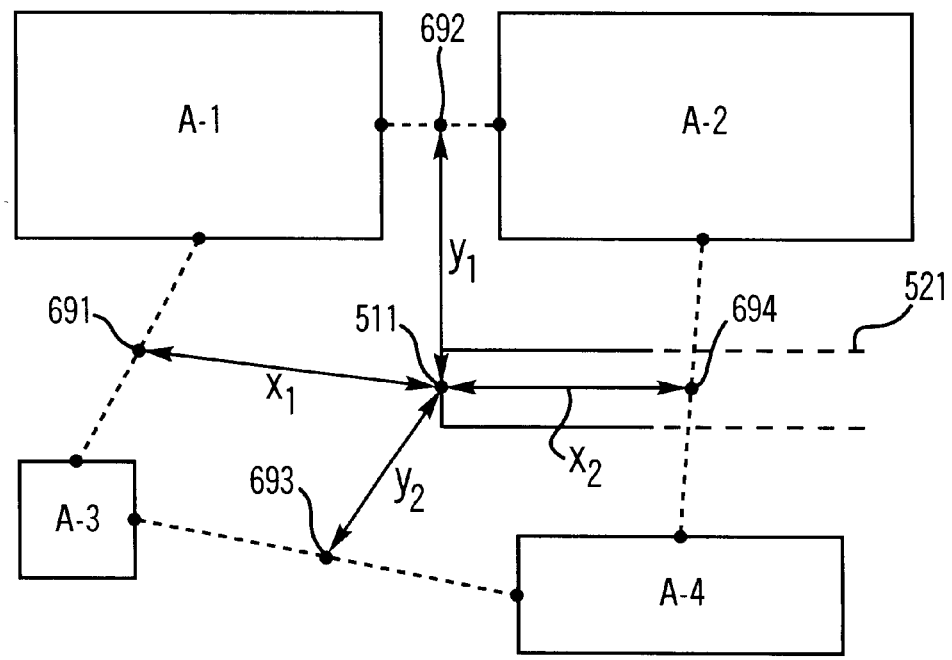
FIGS. 14 and 15 are diagrams illustrating calculations useful in laying out lower levels of an H-Tree clocking layout.

Once an upper structure 536 of the H-Tree clocking layout has been established, the lower structure of the H-Tree clocking layout is developed. An entire H-Tree clocking layout is depicted in FIG. 13, and will be referenced from time to time in connection with the following description. The next set of steps of the preferred process 400 illustrated in FIG. 4, starting with step 420, are performed for each of the circuit block groups A, B, C and D. For each circuit block group, the center points between the edges of adjacent circuit blocks 502 are determined. This step 420 may be explained with reference to FIG. 14. As illustrated therein, a center point 691 is determined between the facing edges of circuit blocks A1 and A3, another center point 692 is determined between the facing edges of circuit blocks A1 and A2, and so on, until four center points 691, 692, 693 and 694 are determined. The determination of the center points 691, 692, 693 and 694 may be carried out by an automated software tool, given the known placement and sizes of the circuit blocks A1, A2, A3 and A4 within the circuit design 520.

In a next step 421, distance calculations are made between the end of the closest termination point of the upper structure 536 for the H-Tree clock layout (in this example, the end 511 of wire 521), and each of the center points 691, 692, 693 and 694. These distance calculations, which may also be achieved using a straightforward automated software routine (given the location information of the center points and wire 521), result in measurements x1, y1, x2 and y2, respectively. In a next step 422, the average of the two horizontal measurements (x1 and x2) and the average of the two vertical measurements (y1 and y2) are calculated, resulting in average horizontal and vertical measurements xavg=(x1+x2)/2 and yavg=(y1+y2)/2. Step 422 is performed for all four circuit block groups A, B, C and D, resulting in an xavg and yavg value for each circuit block group.

In a next step 425, the combination of four xavg and yavg values (selecting either the xavg or yavg value from a given circuit block group) with the least variance is determined. All possible combinations (sixteen total) are evaluated in order to determine the one with the least variance. For example, the combination with the least variance may be one in which xavg is selected for circuit block groups A and C, and yavg is selected for circuit block groups B and D. A principle goal is to arrive at wire lengths at each level of the lower H-Tree structure that are the same length, so as to balance the layout.

Figure 15:
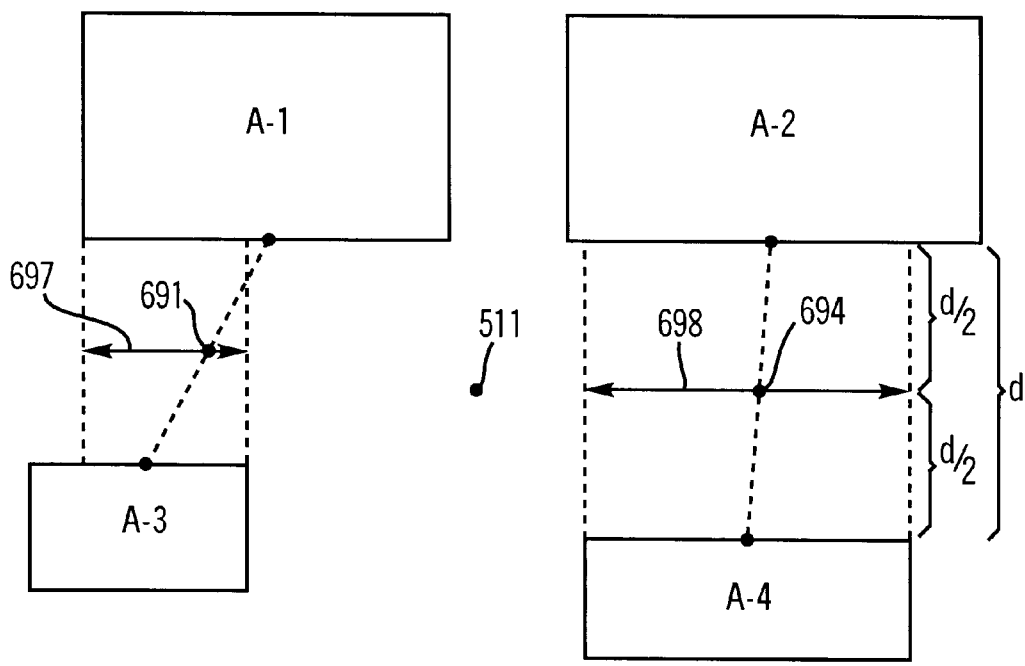

In a next step 426, as further illustrated in FIG. 15, imaginary lines 697 and 698 are created along the center of the routing channel space that are equidistant from the edges of each of the two adjacent circuit blocks 502. Imaginary lines 697 and 698 are preferably bounded by the corners of the circuit blocks 502 to which they apply. Then, in a next step 427, the center points 691 and 694 (for all four circuit block groups A, B, C and D simultaneously) are adjusted along the (bounded) imaginary lines 697 and 698 so as to make not only their distances from the end 511 of wire 521 equal, but also to achieve a common length for all of the wire branches (eight total) in all four circuit block groups. An example of center point adjustment is illustrated in FIG. 15, wherein center point 691 is adjusted to new center point 691' along (bounded) imaginary line 697. This technique may be applied sequentially, for example, to the various center points of all four circuit block groups A, B, C and D, in an attempt to converge upon a common length for all eight wires. Optionally, some boundary checking may be carried out up front to ensure that convergence at a common length for all eight wires is possible.

If convergence to a common length is reached, then, in a next step 430, clock wire segments are routed to the center point of each of the pairs. The resulting clock wire segments for circuit block group A are collectively illustrated in FIG. 13 as wire 562. The same procedure is repeated for each of the circuit block groups B, C and D, resulting in wires 563, 561 and 560, respectively. Each of wires 562, 563, 561 and 560 are preferably the same length, arrived at by the procedure described above. It should be noted that each of wires 562, 563, 561 and 560 should terminate in the center of the routing channel; FIG. 13 is not necessarily to scale in this regard. By terminating in the center of the routing channel, the wires at the next level will be equal in length, balancing the next lowest (and usually last) layer of the H-Tree.

If convergence is not reached at a common length, or alternatively, to optimize the clock signal layout, two of the circuit blocks 502 may be "swapped" between circuit block groups, as set forth in step 435. For example, in FIG. 13, circuit blocks C3 and D4 were swapped, such that wire 561 connects to circuit blocks C4 and D4 (rather than C3), and wire 560 connects to circuit blocks D3 and C3 (rather than D4). In an automated process, swaps may be sequentially tried using different circuit blocks 502 until convergence at a common wire length is reached.

The next step of the process 400 depends to some degree upon whether the lowest level circuit block(s) 502 are sole blocks or else are composite blocks that have been formed by the clustering process described previously herein (or else are the result of performing the layout with respect to thirty-two blocks instead of sixteen). If the lowest level circuit blocks 502 are sole blocks, then, in step 436, for each of two pairs of circuit blocks 502 in each circuit block group A, B, C and D, a wire is routed between the pair of circuit blocks 502 such that it intersects the center of the pair in the middle of the route. Thus, for example, wire 575 should intersect the center of circuit blocks A1 and A3 (i.e., imaginary line 697 in FIG. 15) in the middle of the wire route, and, similarly, wire 574 should intersect the center of circuit blocks A2 and A4 (i.e., imaginary line 698 in FIG. 15) in the middle of the wire route. The end result is a set of "block-to-block" connecting wires 570 through 578, as depicted in FIG. 13.

On the other hand, if one or both of the lowest level circuit blocks 502 are composite blocks or a grouping of blocks, then, in step 436, a wire is routed between the "edge" of the composite circuit block 502 and the other circuit block (or edge of composite circuit block) 502 such that it intersects the center of the two blocks 502 in the middle of the route, similar to the situation with a pair of sole circuit blocks 502. At the end of the wire, a buffer is placed. The purpose of adding the buffer is to terminate the H-Tree at composite groups of blocks in a manner consistent with termination at sole circuit blocks, since each sole circuit block is presumed to have a buffer at its clock pin. Since a composite group does not have a pin, but rather composes two or more circuit blocks (each of which have its own set of I/O pins defined), a buffer placed at the edge of the composite group matches its characteristics to other circuit blocks at which buffers are inherently located. From the buffer, a wire may be routed to the circuit blocks internal to the composite circuit block 502. Such wiring internal to the composite circuit block, and beyond the buffer, does not affect the impedance of the H-Tree.

In a next step 450, the maximum block-to-block route is determined. In other words, the longest of wires 570 through 577 is determined. Unless all of the wires 570 through 577 are of equal length, the layout will not be as balanced as it could be. Thus, in a following step 451, the lengths of the wires are adjusted (by moving the location of the connections and/or sizes of the wires) to account for the differentials between each wire 570 through 577 and the maximum length wire of wires 570 through 577. In one embodiment, this step is accomplished by increasing all of the non-maximum block-to-block lengths such that they are equal to the maximum block-to-block length. In a final step 455, the H-Tree layout is completed.

It may be noted that, in some instances, channels 520 may need to be widened to accommodate the various wires of the H-Tree layout. However, advance floorplanning is generally performed with a goal of providing, to the extent possible, relatively straight, long channels 520 of a width suitable for the routing of clocking signals.

In some cases, wires will be routed from a lower level of the chip design to a higher level of the chip design, or vice versa. Such transitions in level of the chip are referred to as "via's". Preferably, the additional wire length provided by a "via" is taken account of when measuring the distances of wires or laying out the clocking wires, in order to ensure a balanced H-Tree clock layout. Also, it is preferred that if a via is present on one branch of the clock path, a similar via be added to the other branch of the clock path, so as to balance the H-tree layout.

Adjacent wires (e.g., one track apart) may be handled in one of two ways. First, the adjacent wires may be separated by a section of ground. Alternatively, the wires may be placed such that they are two or more tracks apart, with an open track in between them. It will also be understood that wires crossing each other must be on different levels of the chip.

It is preferred that circuit blocks 502 are either entirely "soft", or else are hard but with a "soft collar", such that their pins (particularly the clock input pin) can be rearranged to a suitable location to receive the clocking signal according to the H-Tree layout. A "soft collar" generally refers to a flexible arrangement of I/O pins for the circuit block 502.

Although various embodiments are described herein with respect to clocking signals, it should be understood that similar principles may be applied to other types of signals which will obtain an advantage from a balanced distribution among a number of different circuit blocks.

While preferred embodiments of the invention have been described herein, many variations are possible which remain within the concept and scope of the invention. Such variations would become clear to one of ordinary skill in the art after inspection of the specification and the drawings. The invention therefore is not to be restricted except within the spirit and scope of any appended claims.

What is claimed is:

1. A method for laying out a dispersive signal in an integrated circuit comprising a plurality of circuit blocks, the method comprising the steps of:

dividing the circuit blocks into a plurality of circuit block groups;

determining a center point of each of said circuit block groups based upon center of mass:

routing a wire from an input point through a channel running among said circuit block groups;

successively branching said wire into multiple wire branches, such that wire lengths at corresponding branch levels of different branches are approximately equal; and routing said wire branches to said circuit block groups.

2. The method of claim 1, wherein each of the circuit block groups comprises an equal number of circuit blocks.

3. The method of claim 1, wherein said dispersive signal comprises a clock signal.

4. The method of claim 1, further comprising the step of routing said wire branches to the circuit blocks within each circuit block group.

5. The method of claim 1, wherein the number of circuit blocks comprises a power of two.

6. The method of claim 5, wherein multiple circuit blocks are clustered and treated as a single circuit block for purposes of said method so that the number of circuit blocks will be a power of two.

7. A method for routing a clocking signal in an integrated circuit having a plurality of circuit blocks separated by channels, the method comprising the steps of:

dividing the circuit blocks into a plurality of circuit block groups, each circuit block group covering a contiguous region of the integrated circuit;

determining a center point of each of said circuit block groups based upon center of mass;

determining whether any of said center points lies within a circuit block and, if so, moving the determined center point to a closest channel thereto;

calculating distances horizontally and vertically between said center points, and selecting pairings of the center points based upon the least difference between the calculated distances;

routing a pair of clocking wires between the center points within each of the selected pairs of center points;

determining a wire center point of each of said pair of clocking wires;

routing a main clocking wire to the wire center point of each of said pair of clocking wires; and for each of said circuit block groups, routing clocking wires from the center point of the circuit block group to the circuit blocks of the circuit block group.

8. The method of claim 7, wherein each of the circuit block groups comprises an equal number of circuit blocks.

9. The method of claim 7, wherein the number of circuit blocks comprises a power of two.

10. The method of claim 9, wherein multiple circuit blocks are clustered and treated as a signal circuit block for purposes of said method so that the number of circuit blocks will be a power of two.

11. The method of claim 7, wherein a width of said main clocking wire approximately equals a combined width of both of said pair of clocking wires.

12. The method of claim 7, wherein said step of routing, for each of said circuit block groups, clocking wires from the center point of the circuit block group to the circuit blocks of the circuit block group comprises the step of:

for each circuit block group, determining circuit block group internal center points between facing edges of adjacent circuit blocks within the circuit block group;

for each circuit block group, calculating distances from a nearest terminating point of said pair of clocking wires to each of said circuit block group internal center points;

for each circuit block group, calculating an average of said distances horizontally and vertically, thereby obtaining an average horizontal measurement and an average vertical measurement;

collectively for all of said circuit block groups, selecting a combination of average horizontal measurements and average vertical measurements with a least amount of variance;

adjusting said circuit block group internal center points within a bounded channel so as to achieve substantially identical distances; and for each circuit block group, routing clocking wires from the nearest terminating point of said pair of clocking wires to each of said circuit block group internal center points.

13. The method of claim 12, further comprising the step of, for each circuit block group, routing clocking wires to each of said circuit blocks from said circuit block group internal center points.

14. A processing system comprising a computer readable medium storing instructions which, when executed by the processing system, cause the processing system to perform a method of routing a clock signal wiring in an integrated circuit having plurality of circuit blocks, the method comprising the steps of:

dividing the circuit blocks into a plurality of circuit block groups;

determining a center point of each of said circuit block groups based upon center of mass;

routing a wire from an input point through a channel running among said circuit block groups;

successively branching said wire into multiple wire branches, such that wire lengths at corresponding branch levels of different branches are approximately equal; and routing said wire branches to said circuit block groups.

15. The system of claim 14, wherein each of the circuit block groups comprises a approximately equal number of circuit blocks.

16. The system of claim 14, wherein the number of circuit blocks comprises a power of two.

17. The system of claim 14, wherein multiple circuit blocks are clustered and treated as a signal circuit block for the purpose of said method so that the number of circuit blocks will be a power of two.

18. A processing system comprising a computer readable medium storing instructions which, when executed by the processing system, cause the processing system to perform a method of routing a clock signal wiring in an integrated circuit having a plurality of circuit blocks separated by channels, the method comprising the steps of:

dividing the circuit blocks into a plurality of circuit block groups, each circuit block group covering a contiguous region of the integrated circuit;

determining a center point of each of said circuit block groups based upon center of mass;

determining whether any of said center points lies within a circuit block and, if so, moving the determined center point to a closest channel thereto;

calculating distances horizontally and vertically between said center points, and selecting pairings of the center points based upon the least difference between the calculated distances;

routing a pair of clocking wires between the center points within each of the selected pairs of center points;

determining a wire center point of each of said pair of clocking wires;

routing a main clocking wire to the wire center point of each of said pair of clocking wires; and for each of said circuit block groups, routing clocking wires from the center point of the circuit block group to the circuit blocks of the circuit block group.

19. The system of claim 18, wherein each of the circuit block groups comprises a approximately equal number of circuit blocks.

20. The system of claim 18, wherein the number of circuit blocks comprises a power of two.

21. The system of claim 18, wherein multiple circuit blocks are clustered and treated as a single circuit block for purposes of said method so that the number of circuit blocks will be a power of two.

22. The system of claim 18, wherein a width of said main clocking wire approximately equals a combined width of both of said pair of clocking wires.

23. The system of claim 18, wherein said step of routing, for each of said circuit block groups, clocking wires from the center point of the circuit block group to the circuit blocks of the circuit block group comprises the steps of:

for each circuit block group, determining circuit block group internal center points between facing edges of adjacent circuit blocks within the circuit block group;

for each circuit block group, calculating distances from a nearest terminating point of said pair of clocking wires to each of said circuit block group internal center points;

for each circuit block group, calculating an average of said distances horizontally and vertically, thereby obtaining an average horizontal measurement and an average vertical measurement;

collectively for all of said circuit block groups, selecting a combination of average horizontal measurements and average vertical measurements with a least amount of variance;

adjusting said circuit block group internal center points within a bounded channel so as to achieve substantially identical distances; and for each circuit block group, routing clocking wires from the nearest terminating point of said pair of clocking wires to each of said circuit block group internal center points.

24. The system of claim 23, wherein the method further comprises the step of, for each circuit block group, routing clocking wires to each of said circuit blocks from said circuit block group internal center points.

* * * * *

UNITED STATES PATENT AND TRADEMARK OFFICE
CERTIFICATE OF CORRECTION

PATENT NO.    : 6,651,237 B2  
DATED         : November 18, 2003  
INVENTOR(S)   : Laurence H. Cooke and Kumar Venkatramani It is certified that error appears in the above-identified patent and that said Letters Patent is hereby corrected as shown below:

Column 11,
Line 43, please replace "signal" with -- single --.

Column 12,
Line 35, please replace "signal" with -- single --.

Signed and Sealed this

Thirteenth Day of January, 2004

JON W. DUDAS
*Acting Director of the United States Patent and Trademark Office*